United States Patent [19]

Börnert

[11] Patent Number: 5,635,837
[45] Date of Patent: Jun. 3, 1997

[54] MR METHOD UTILIZING INDUCTIVELY COUPLED RECEIVING COIL SYSTEMS

[75] Inventor: Peter Börnert, Hamburg, Germany

[73] Assignee: U.S. Philips Corporation, New York, N.Y.

[21] Appl. No.: 590,254

[22] Filed: Jan. 23, 1996

[30] Foreign Application Priority Data

Jan. 26, 1995 [DE] Germany .................. 195 02 374.9

[51] Int. Cl.$^6$ .................................................. G01R 33/20
[52] U.S. Cl. ................................................ 324/309; 324/318
[58] Field of Search ............................ 324/318, 309, 324/307, 300, 314, 322; 128/653.2, 653.5

[56] References Cited

U.S. PATENT DOCUMENTS

| | | | |
|---|---|---|---|
| 4,812,753 | 3/1989 | Fuderer et al. | 324/307 |
| 5,179,332 | 1/1993 | Kang | 324/313 |
| 5,208,534 | 5/1993 | Okamoto et al. | 324/309 |
| 5,216,367 | 6/1993 | Mori | 324/318 |
| 5,221,901 | 6/1993 | Decke et al. | 324/318 |
| 5,302,901 | 4/1994 | Snelton | 324/322 |
| 5,471,142 | 11/1995 | Wang | 324/318 |

FOREIGN PATENT DOCUMENTS 0412824  2/1991  European Pat. Off. .

Primary Examiner—Sandra I. O'Shea
Assistant Examiner—Raymond Y. Mah
Attorney, Agent, or Firm—Jack D. Slobod

[57] ABSTRACT

A magnetic resonance (MR) method utilizes a plurality of inductively coupled receiving coil systems quasisimultaneously to measure a nuclear magnetization distribution in an examination zone. The method involves excitation of the nuclear magnetization in an examination zone, exposed to a uniform, steady magnetic field, by means of at least one RF pulse, multiple rephasing of the exited nuclear magnetization in order to generate a plurality of MR echo signals whose number at least equals the number m of receiving coil systems, and switching over the receiving coil systems in such a manner that, subsequent to said excitation, each receiving coil system receives at least one MR echo signal while at the same time alii respective other coil systems are inactive.

8 Claims, 2 Drawing Sheets

MR METHOD UTILIZING INDUCTIVELY COUPLED RECEIVING COIL SYSTEMS

BACKGROUND OF THE INVENTION

1. Field of the Invention

The invention relates to an MR method utilizing a plurality of inductively coupled receiving coil systems. The invention also relates to an MR apparatus for carrying out the method.

2. Description of the Related Art

For given MR examinations it is desirable to acquire MR signals from the same spatial zone of an object by means of different, inductively coupled coils. For example, from EP-OS 271 123 it is known to form an MR image by means of a whole-body coil and on the other hand a surface coil. The image of the whole-body coil, having a low but locally uniform sensitivity, is intended to correct the image of the surface coil which has a high sensitivity which, however, is highly dependent on location. When the two coil systems are inductively coupled to one another and the MR signals are simultaneously received from the two coils, unacceptable results are obtained, for example image artifacts occur and a drastic deterioration of the signal-to-noise ratio. In one version of the known method, therefore, the MR signals, are acquired successively in time. It the coils were suitably recoupled from one another during signal reception, the described negative effects in the case of simultaneous signal reception, however, could be avoided.

The same problems occur when instead of one surface coil use is made of a receiving coil system consisting of a plurality of surface coils, for example as known from EP-OS 412 824 (FIG. 16), in which the circumstances become even more complex when the individual surface coils are also coupled to one another. The same problems may also occur when a catheter or a surgical instrument for interventional MR examinations is provided with a small signal receiving coil for the purpose of localization and when parallel therewith a globally or locally receiving second coil is used.

As has already been stated, these problems can be avoided when all inductively coupled coils do not receive the signals simultaneously but successively, and when the respective non-receiving coils are driven in such a manner that they are electrically inactive during this phase, for example by detuning or by damping. However, this procedure prolongs the measuring time required for acquiring the MR signals and changes of state of the object could then occur (motion etc.), making it difficult to relate the MR images resulting from the separate measurements to one another.

SUMMARY OF THE INVENTION

It is an object of the present invention to provide a method which offers perfect results in the case of coupled receiving coil systems, without significantly prolonging the measuring time. This object in accordance with the invention is achieved in that the method comprises the following steps:

a) excitation of the nuclear magnetization in an examination zone, exposed to a uniform, steady magnetic field, by means of at least one RF pulse, b) multiple rephasing of the excited nuclear magnetization in order to generate a plurality of MR echo signals whose number at least equals the number m of receiving coil systems, c) switching over the receiving coil systems in such a manner that subsequent to said excitation each receiving coil system receives at least one MR signal while at the same time all respective other coil systems are inactive.

In accordance with the invention, the nuclear magnetization excited once is read a number of times in that it is rephased a number of times, so that each rephasing operation produces an MR echo signal, each receiving coil system receiving at least one MR echo signal while at the same time the respective other receiving coil systems are inactive and hence recoupled. Because the MR echo signals are thus picked up almost simultaneously, the MR images derived therefrom will not be influenced differently by motions and/or the establishing of a state of equilibrium of the available magnetization in the case of sequences applied in rapid succession. The measuring time is only insignificantly prolonged.

The rephasing of the nuclear magnetization can be realized by way of a respective 180° RF pulse, thus producing a sequence which is also known as RARE. However, rephasing can also be realized by continuously switching over the polarity of the read gradient in the presence of which the MR echo signals are acquired, so that a sequence of the EPI type is obtained. Hybrid forms are also possible, for example in that each time after a plurality of polarity reversals of the read gradient a 180° refocussing pulse is generated, which ultimately results in a sequence resembling a GRASE sequence. The difference between the invention and these known sequences consists inter alia in that the MR echo signals are not picked up by a receiving coil system but by each time one of the various receiving coil systems in an alternating fashion.

A receiving coil system may comprise a receiving coil or a plurality of receiving coils which are not coupled to one another and whose signals are separately processed. The de-activation of the receiving coil systems which are not to receive the instantaneously occurring MR echo signal can be realized in that these coil systems are detuned or damped to such an extent that they cannot influence the reception of the MR echo signal by the respective active receiving coil system.

It is to be noted that such de-activation of coils which are not to receive of the instantaneous MR signal is known per se from DE-OS 40 30 878 which corresponds to (U.S. Pat. No. 5,221,901) as well as from U.S. Pat. 5,216,367. However, these coils serve to read the nuclear magnetizations excited at different instants and at different locations within the examination zone. For example, FIGS. 2 and 3 of U.S. Pat. No. 5,216,367 illustrate a multi-slice method in which slices are excited alternately at the left-hand side and the right-hand side of the skull, for each excitation only one MR signal being read by one of the two surface coils situated to the left and to the right of the skull.

The invention can also be used for MR methods in which the various receiving coil systems need not receive the same number of MR signals. For MR applications where the receiving coil systems must process the same number of MR signals, however, according to a further version of the invention m.n MR echo signals are generated subsequent to an excitation of the nuclear magnetization, m being the number of receiving coil systems and n an integer number larger than zero, the receiving coil systems being cyclically switched over so that each receiving coil system receives a total of n MR echo signals. Various possibilities exist as regards the implementation of the receiving cycles defined by the cyclic switching-over of the receiving coil systems.

According to a further version of the invention a first possibility consists in that subsequent to a single excitation the receiving coil systems are activated in n receiving cycles, in each receiving cycle all receiving coil systems receiving a respective MR echo signal which has been influenced by the gradient fields in the same way as those received by the other receiving coil systems, the gradients determining the frequency or the phase being varied from one receiving cycle to another. Thus, in each receiving cycle each receiving coil system receives only one MR echo signal. During reception it is recoupled from all other receiving coil systems, because the latter are de-activated.

In another version of the invention a further possibility consists in that subsequent to an excitation the receiving coil systems are activated in a single receiving cycle in which each receiving coil system successively detects n MR signals, successive MR echo signals being influenced differently by a phase encoding gradient.

Whereas according to the one possibility n receiving cycles are completed, where the receiving coil systems receive a respective MR echo signal in each receiving cycle, according to the other possibility there is only a single receiving cycle, during which each receiving coil system successively detects all n MR echo signals, destined therefor.

An attractive further version of the fast method, which utilizes, for example only two receiving coil systems, consists in that the rephasing of the nuclear magnetization is performed by means of a read gradient of alternating polarity, the receiving cycles being configured so that each receiving coil system receives only MR echo signals occurring at the same polarity of the read gradient, and that a phase encoding gradient is varied between successive receiving cycles. Because each receiving coil system receives only MR echo signals occurring at the same polarity of the read gradient, the so-called N/2 ghost images which could otherwise be observed in the case of such a EPI sequence are avoided.

In another version, the two coil systems are alternately switched on and calibration data for correcting the locally inhomogeneous sensitivity of the surface coil system is derived from the MR echo signals of both coil systems. The calibration data thus acquired enable correction of the MR images acquired by means of the surface coil system during further MR measurements (using inter alia completely different sequences). The surface coil system may then consist of a plurality of surface coils, the so-called "synergy" coil thus formed has a high vocally inhomogeneous) sensitivity or a very attractive signal-to-noise ratio.

An MR apparatus for carrying out the method claimed in claim 1 in accordance with the invention comprises a magnet for generating a uniform, steady magnetic field, a coil system which can be connected to a transmitter in order to generate RF pulses for the excitation of the nuclear magnetization, gradient coil systems for generating magnetic gradient fields, at least two receiving coil systems which are inductively coupled to one another, switching means for switching over the receiving coil systems in such a manner that each time only one receiving coil system can operate in the receiving mode, a control unit for controlling the components of the MR apparatus in such a manner that the following sequence is obtained:

a) excitation of the nuclear magnetization in an examination zone, exposed to a uniform, steady magnetic field, by means of at least one RF pulse, b) multiple rephasing of the excited nuclear magnetization in order to generate a plurality of MR echo signals whose number at least equals the number m of receiving coil systems, c) switching over the receiving coil systems in such a manner that subsequent to said excitation each receiving coil system receives at least one MR echo signal while at the same time all respective other coils are inactive.

These and other aspects of the invention will be apparent from and elucidated with reference to the embodiments described hereinafter.

Figure 1:
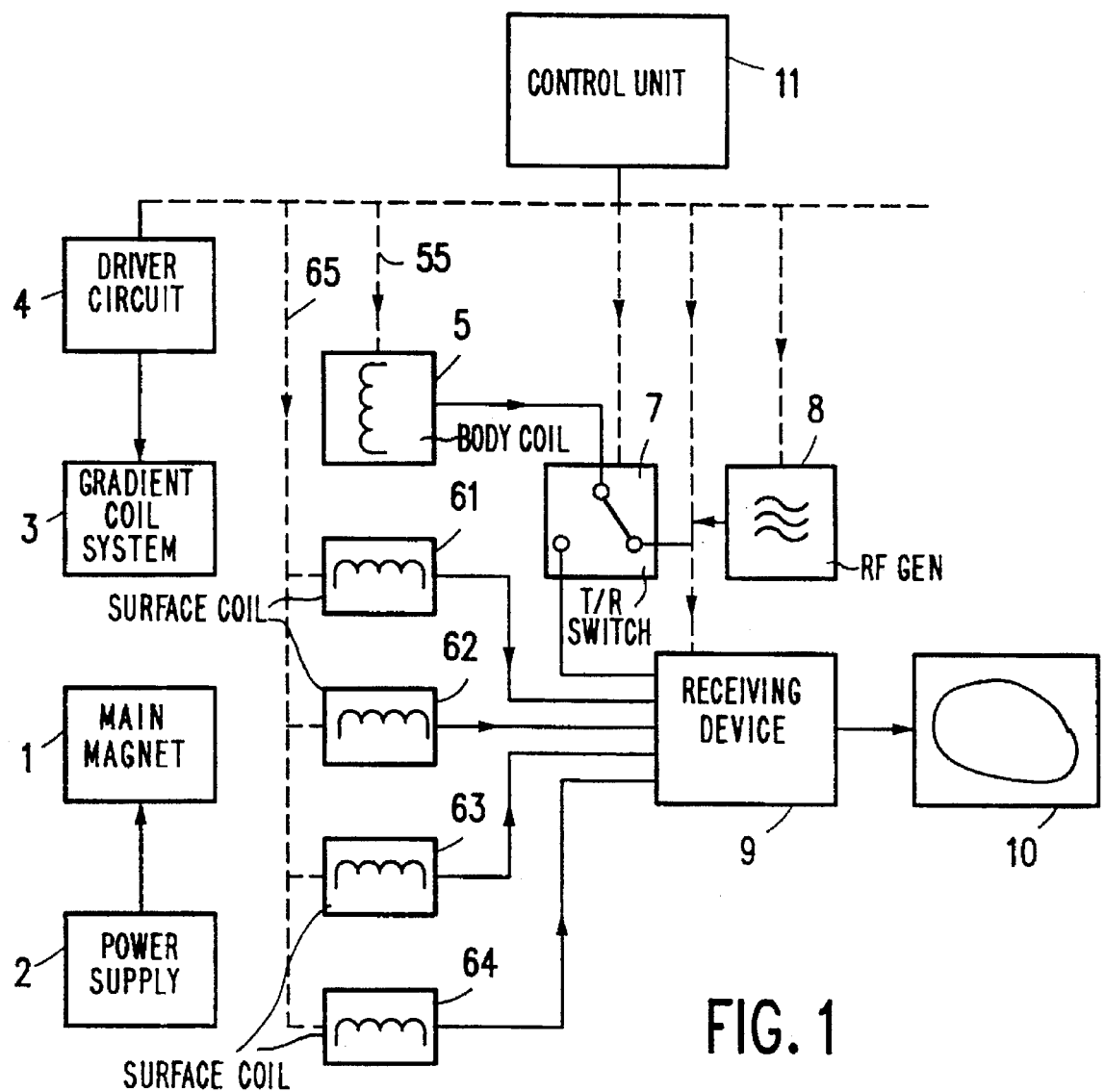
FIG. 1 shows a block diagram of an MR apparatus in which the invention can be used.

The reference 1 in the block diagram of FIG. 1 denotes a preferably superconducting main magnet which generates a steady, uniform magnetic field in an examination zone in which a patient may be arranged. The current required for this purpose is supplied by a power supply unit 2. The reference 3 denotes a gradient coil system whereby a magnetic gradient field can be generated which extends in the direction of the steady magnetic field and whose gradient extends either in the same direction or in two directions extending perpendicularly thereto and perpendicularly to one another. The necessary currents are supplied by a driver circuit 4, the variation in time of the currents being controlled by a control unit 11 which can be realized by means of a suitably programmed processor.

There is also provided an RF generator 8 which is capable of generating pulsed oscillations having the Larmor frequency of the spin system. A transmission/reception switching unit 7 connects a body coil system 5 selectively to a receiving device 9 or to the RF generator 8. The customarily cylindrical body coil system encloses the body of the patient over a given length during an MR examination and generates an essentially uniform RF magnetic field therein. Also provided is a surface coil system which consists of four surface coils 61 . . . 64. It preferably comprises more than four surface coils, for example six or twelve, but fewer coils are also feasible.

Figure 2:
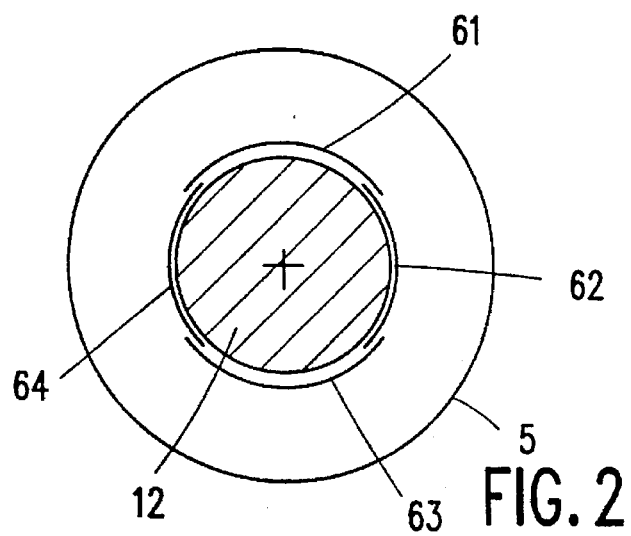
FIG. 2 shows a body coil system and a surface coil system.

FIG. 2 shows the arrangement in space of the body coil system 5, which may be a coil of the bird-cage type, and the four surface coils 61 . . . 64. The four surface coils 61 . . . 64 may be arranged on a flexible support (not shown) which is wrapped around a patient 12. The coils are arranged on the support in such a manner that they overlap in a suitably defined zone, and adequate decoupling is achieved between these surface coils. The sensitivity of the surface coil system formed by these four coils is higher than that of the body coil system 5, but its sensitivity is inhomogeneous in relation to the examination zone in which the patient is situated.

The units 5 . . . 9 and 61 . . . 64 are controlled by the control unit 11. For the surface coils 61 . . . 64 there is provided a common control lead 65. When the signal on the control lead 65 is "high", the surface coils are active; otherwise they are inactive. The switching over from the active to the inactive state or vice versa can be realized, for example by means of PIN diodes as disclosed in U.S. Pat. No. 5,216,367. The body coil system 5 can also be controlled to an active state and an inactive state via a control lead 55. In the transmission mode the transmission/reception switching unit 7 is in the position shown in the drawing, so that the oscillations produced by the RF generator 6 are applied to the body coil 9 which generates an RF pulse exiting the nuclear magnetization in the examination zone. The surface coils 61 . . . 64 are inactive in the transmission mode.

When the transmission/reception switching unit 7 is switched to the other position by the control unit 11, the body coil system 5 can receive the MR signals arising in the examination zone, provided that it is activated via the control lead 55.

Instead of a body coil system which acts as a transmission coil as well as a receiving coil, separate coils may be provided for the transmission mode and the receiving mode. The body coil system provided for the receiving mode should then have a spatially at least approximately constant sensitivity.

For each coil 5, 61 . . . 64 the receiving device 9 comprises a respective channel in which the MR signal received by the respective coil is amplified, transposed to a lower frequency range and digitized and in which a respective MR image can be reconstructed from the digitized MR signals. The MR images generated in the receiving device 9 can be displayed on a monitor 11. Each time only one of the coil systems 5 on the one hand and 61 . . . 64 on the other hand is active. When the MR signals are to be received by the body coil system 5, the surface coils 61 . . . 64 are de-activated by the control unit 11. However, if reception is to take place by means of the surface coils 61 . . . 64, the body coil system 5 is de-activated. As a result, the two coil systems will not interact.

It is assumed that an MR examination has been carried out by means of a suitable MR method offering a high spatial resolution, during which the four surface coils 61 . . . 64 have (simultaneously) acquired a sufficient number of MR signals so as to reconstruct a respective MR image therefrom. Because the four surface coils exhibit a locally inhomogeneous sensitivity, the effects thereof will be visible in each MR image of the surface mils 61 . . . 64 but also in an MR image derived therefrom by simple superposition; consequently a homogeneous object would then be reproduced, for example with an inhomogeneous brightness distribution.

Therefore, correction necessitates a calibration measurement whereby the location-dependency of the sensitivity of the surface coils is determined. During this calibration measurement, the body coil system 5 as well as the surface coils 61 . . . 64 should measure a respective MR image. These MR images may have a low spatial resolution, because the sensitivity of the surface coils changes only comparatively slowly as a function of location. However, they should exhibit the same contrast behavior and should be picked up as simultaneously as possible so as to ensure that calibration is not falsified by motions in the examination zone (which is the same as during the preceding MR examination).

Figure 3:
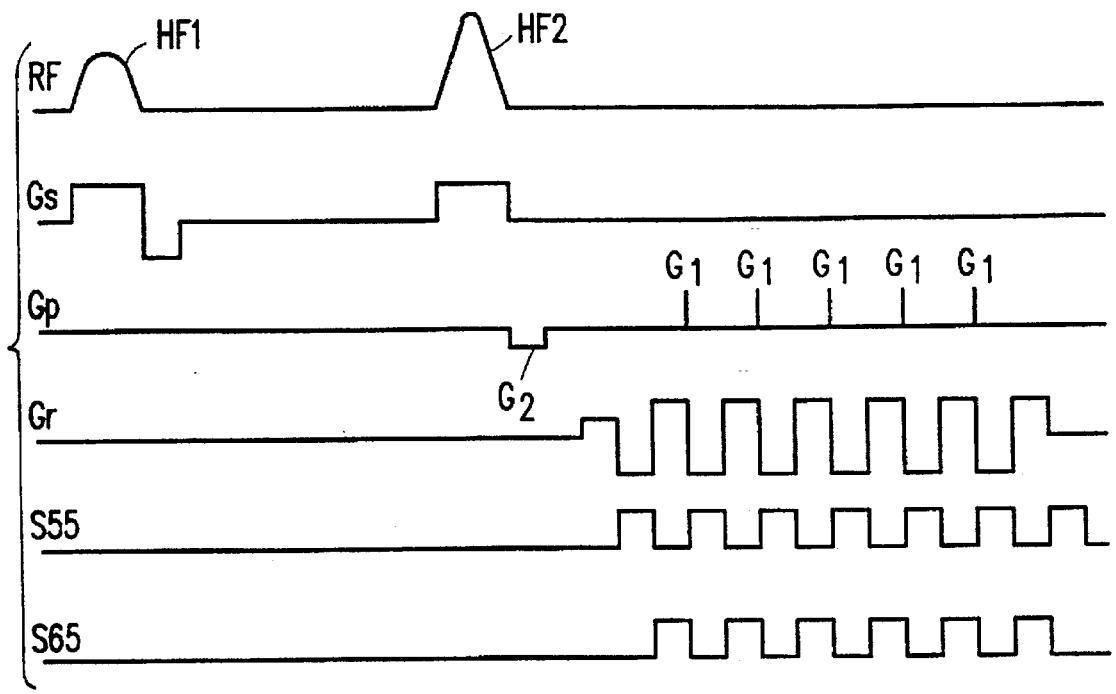
FIG. 3 shows the variation in time of various signals occurring in a first version of the method in accordance with the invention.

FIG. 3 shows a calibration measurement which is suitable for this purpose. During to this measurement, first a 90° RF pulse HF1 and subsequently a 180° RF pulse HF2 (first line) are applied to the examination zone. These pulses are accompanied by a slice selection gradient $G_s$ (second line), so that the RF pulses influence the nuclear magnetization in a given slice, i.e. the same slice as measured during the preceding (or subsequent) MR examination with spatial resolution. Subsequently, the body coil 5 on the one hand and the surface coil system 61 . . . 64 on the other hand are activated and de-activated cyclically or in an alternating fashion (because only two receiving coil systems are concerned), as appears from the lines 5 and 6 of FIG. 3 which show the control signals $S_{55}$ and $S_{65}$ on the leads 55 and 65. Simultaneously with the switching-over of the coils, the polarity of a read gradient $G_r$ is changed, so that the nuclear magnetization is rephased and the respective active coil system picks up an MR signal (fourth line).

After each cycle, i.e. after each coil system has received once, a short pulse of the phase encoding gradient $G_p$ (third line) is generated at the zero crossing of the read gradient, i.e. a so-called blip, so that the phase encoding of the subsequently generated MR signals changes. The calibration measurement is completed after n of such cycles. The position in time of the signals may be chosen so that after half the number (n/2) of cycles the distance in time from the 180° RF pulse HF2 is equal to its distance from the first RF pulse HF1. In this case a phase encoding gradient $G_2$ whose time integral amounts to half the time integral of all n blips $G_1$ should be applied prior to the first cycle.

The MR signals thus acquired, or the MR images of low spatial resolution derived therefrom, enable correction of the MR image previously (or subsequently) picked up exclusively by the surface coils 61 . . . 64 with a high resolution. This procedure is described in detail in the prior German Patent Application P 44 27 429.7 which corresponds to U.S. Ser. No. 08/510,156, filed Aug. 2, 1995, which is explicity referred to herein.

The advantage of a calibration carried out in this manner consists in that MR signals associated with the same path in the so-called K-space are quasi-simultaneously measured. Moreover, each of the two cell systems detects the MR signals at each time the same polarity of the read gradient (the body cell system 5 which negative polarity and the surface coil system 61 . . . 64 at positive polarity). The typical N/2 image artifacts which could occur in the case of sequences with alternating polarity of the gradient are thus avoided.

The described method can be modified in various respects. For example, the refocussing 180° RF pulse HF2 may be omitted, so that the switching cycles shown on the lines 3 to 6 of FIG. 3 can take place subsequent to the first RF pulse HF1. Moreover, the first pulse need not necessarily to be a 90° RF pulse; use can be made instead of an RF pulse which deflects the nuclear magnetization out of its rest state by less then 90°. If the spatial resolution to be achieved by means of the n MR signals in the direction of the phase encoding gradient still is not sufficient, the sequence shown in FIG. 3 can be repeated in such a manner that it deviates merely in respect of the magnitude or the sign of the phase encoding gradient $G_2$ (third line).

If the four surface coils 61 . . . 64 were not decoupled from one another, in order to prevent image artifacts they should not simultaneously receive MR signals. The coils 5 and 61 . . . 64 should then be cyclically switching on, a cycle then comprising the reception of a respective MR signals by each of these five coils. The blips $G_1$ should then occur not before the respective end of one of these enlarged cycles.

In the event that the actual MR examination can be executed by means of a sequence of the same type as used to execute the calibration measurement, they can be carried out also in a common data acquisition. Because the calibration images require a substantially lower spatial resolution for than the actual MR examination, for the reception of one MR signal by the body coil system 5, the surface coils 61 ... 64 should receive several (for example, eight or sixteen) MR signals by. The MR signal picked up by the body coil system 5 and an MR signal with the same phase encoding picked up by the coils 61 ... 64 should then be used for the calibration.

The sequence shown for one slice in FIG. 3 can be simply repeated for neighboring slices, because the nuclear magnetization in each slice is excited quasi only once.

The method shown in FIG. 3 is a 2DFT or 3DFT method, in which the phase encoding is varied by means of a respective blip from one cycle to another. However, instead of such a method use can be made of a projection-reconstruction method in which, without phase encoding, the direction of the read gradient is varied from one cycle to another. The method can furthermore be used for MR sequences which acquire the MR data in other ways.

The invention is not limited to methods in which the MR image of a first coil is to be calibrated by means of MR data of a further MR coil which is coupled thereto; it can be used whenever it is necessary to detect the nuclear magnetization distribution in an examination zone by means of a plurality of coils which are so strongly coupled to one another that simultaneous acquisition would cause image artifacts. A further example in this respect is interventional MR in which, for example the progress of a catheter comprising an active receiving coil (or another surgical tool) in the human body is to be observed. It may then be necessary on the one hand to acquire each time a complete set of image data, but on the other hand it may also be necessary to measure individual projections of the object for the three-dimensional navigation of the catheter (or the surgical tool).

Figure 4:
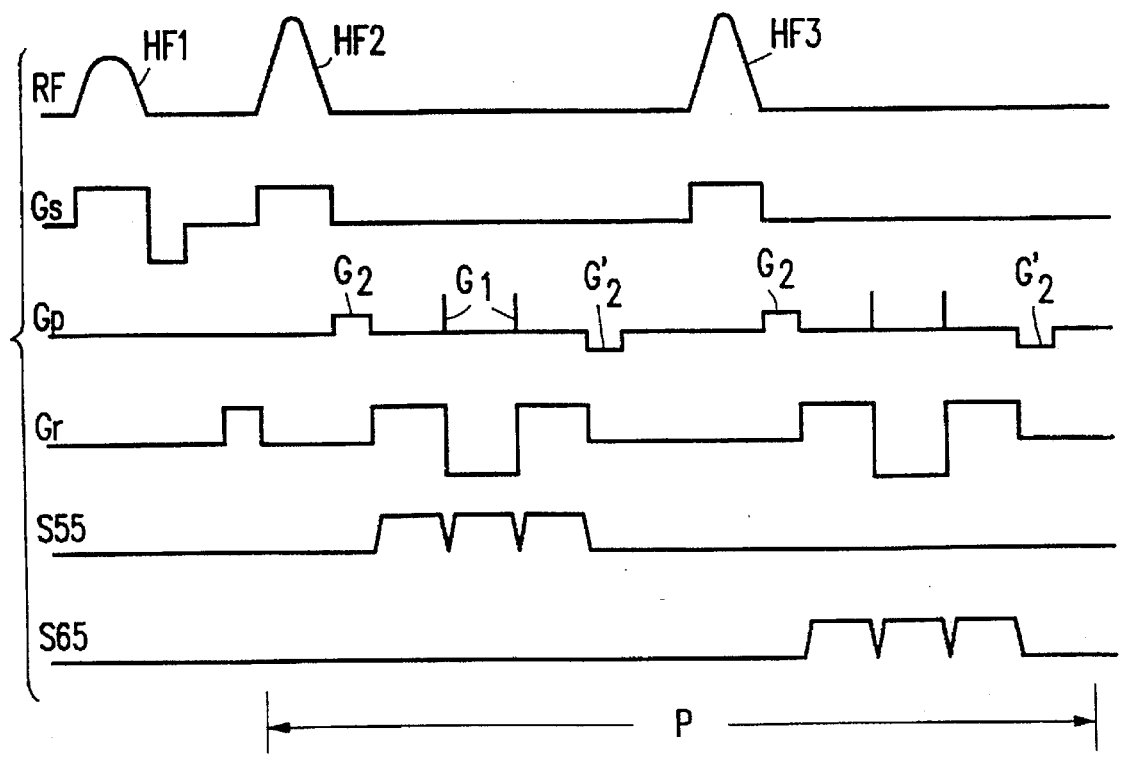
FIG. 4 shows the variation in time of these signals in a second version.

FIG. 4 shows a further embodiment which is based on a so-called GRASE sequence in which rephasing is performed on the one hand by 180° RF pulses and on the other hand by an alternating read gradient. Thus, the 90° RF pulse HF1 (first line) is succeeded by a first 180° RF pulse HF2. Subsequently, the read gradient $G_r$ (fourth line) is switched on first with a positive polarity, then with a negative polarity, and then with a positive polarity again, so that three MR signals are obtained which exhibit a different phase encoding due to the blips $G_1$. Prior to the read gradient $G_{rr}$, the phase encoding gradient $G_p$ is applied ($G_2$) and subsequent to the read gradient it is de-activated ($G_2'$); the time integral over $G_2$, $G_2'$ and the blips $G_1$ must then be zero. The three MR signals subsequent to the RF pulse HF2 are received exclusively by the coil 5, because it is activated by the signal $S_{55}$, whereas the signal $S_{65}$ de-activates the coils 61 ... 64 in this phase. These MR echo signals are also referred to as having been detected under the first "Hahn echo".

Subsequently, an RF pulse HF3 is generated, after which the temporal variation of the phase encoding gradient $G_p$ and of the read gradient $G_r$ is the same as after HF2. However, under this Hahn echo the three MR gradient echo signals are picked up by the coils 61 ... 64, because they are activated by the signal $S_{65}$ whereas the coil 5 is inactive.

The part of the sequence which is noted by the reference P in the drawing is then repeated several times, merely $G_2$ and $G_2'$ then being varied from one repeat to another, so that the resultant MR gradient echo signals exhibit different phase encoding.

A further possibility consists in measuring only a phase encoding step in the gradient echo under each Hahn echo for all receiving coil systems. The blip $G_1$ thus becomes identical to zero and $G_2=-G_2'$ is chosen. However, this approach makes sense only in the case of an odd number of receiving coil systems.

The sequence shown in FIG. 4 can be modified in that in the interval between two refocussing RF pulses HF2 and HF3 more echo signals, but also fewer echo signals, can be received. If each time only one MR echo signal is generated, a RARE sequence is obtained in which each time another coil is ready to receive after a 180° RF pulse.

I claim:

1. An MR method, utilizing a plurality of inductively coupled receiving coil systems, comprising the following steps:

a) excitation of the nuclear magnetization in an examination zone, exposed to a uniform, steady magnetic field, by means of at least one RF pulse, b) multiple rephasing of the excited nuclear magnetization in order to generate a plurality of MR echo signals whose number at least equals the number m of receiving coil systems, c) switching over the receiving coil systems in such a manner that subsequent to said excitation each receiving coil system receives at least one MR echo signal while at the same time all respective other coil systems are inactive.

2. An MR method as claimed in claim 1, wherein MXN MR echo signals are generated subsequent to an excitation of the nuclear magnetization, m being the number of receiving coil systems and n an integer number larger than zero, the receiving coil systems being cyclically switched over so that each receiving coil system receives a total of n MR echo signals.

3. An MR method as claimed in claim 2, wherein subsequent to a single excitation the receiving coil systems are activated in n receiving cycles, in each receiving cycle all receiving coil systems receiving a respective MR echo signal which has been influenced by the gradient fields in the same way as those received by the other receiving coil systems, the gradients determining the frequency or the phase being varied from one receiving cycle to another.

4. An MR method as claimed in claim 2, wherein subsequent to an excitation the receiving coil systems are activated in a single receiving cycle in which each receiving coil system successively detects n MR signals, successive MR echo signals being influenced differently by a phase encoding gradient.

5. An MR method as claimed in claim 3, wherein the rephasing of the nuclear magnetization is performed by means of a read gradient of alternating polarity, the receiving cycles being configured so that each receiving coil system receives only MR echo signals occurring at the same polarity of the read gradient, and that a phase encoding gradient is varied between successive receiving cycles.

6. An MR method as claimed in claim 5, utilizing a surface coil system having a locally inhomogeneous sensitivity and a coil system having a locally homogeneous sensitivity, wherein the two coil systems are alternately switched on and that calibration data for correcting the locally inhomogeneous sensitivity of the surface coil system is derived from the MR echo signals of both coil systems.

7. An MR method as claimed in claim 4, wherein a 180° RF pulse is generated after the reception of n MR echo signals by a receiving coil system and before the activation of the next receiving coil system.

8. An MR apparatus for measuring a nuclear magnetization distribution in an examination zone, comprising:

a magnet for generating a uniform, steady magnetic field in the examination zone, a coil system which can be connected to a transmitter in order to generate RF pulses for the excitation of the nuclear magnetization in the examination zone, gradient coil systems for generating magnetic gradient fields in the examination zone, at least two receiving coil systems which are inductively coupled to one another for receiving magnetic-resonance signals from the examination zone when operating in a receiving mode, which magnetic resonance signal are produced as a result of the excited nuclear magnetization, switching means for switching over the receiving coil systems in such a manner that each time only one receiving coil system can operate in the receiving mode, a control unit for controlling the components of the MR apparatus in such a manner that the following sequence is obtained:

a) excitation of the nuclear magnetization in an examination zone, exposed to a uniform, steady magnetic field, by means of at least one RF pulse, b) multiple rephasing of the excited nuclear magnetization in order to generate a plurality of MR echo signals whose number at least equals the number m of receiving coil systems, and c) switching over the receiving coil systems in such a manner that subsequent to said excitation each receiving coil system receives at least one MR echo signal while at the same time all respective other coils are inactive.

* * * * *